United States Patent [19]
Takahashi et al.

[11] Patent Number: 6,095,398
[45] Date of Patent: Aug. 1, 2000

[54] SOLDER BALL ARRANGEMENT DEVICE

[75] Inventors: Nobuaki Takahashi; Naoji Senba; Yuzo Shimada, all of Tokyo, Japan

[73] Assignee: NEC Corporation, Tokyo, Japan

[21] Appl. No.: 09/088,069

[22] Filed: Jun. 1, 1998

[30] Foreign Application Priority Data

Jun. 2, 1997 [JP] Japan ..................... 9-143662

[51] Int. Cl.[7] .............. B23K 1/00; B23K 35/12
[52] U.S. Cl. ............ 228/41; 228/180.22; 228/246
[58] Field of Search ............. 228/180.22, 244, 228/245, 246, 6.1, 6.2, 41

[56] References Cited

U.S. PATENT DOCUMENTS

| | | | |
|---|---|---|---|
| 5,425,493 | 6/1995 | Interrante et al. | 228/110.1 |
| 5,601,229 | 2/1997 | Nakazato et al. | 288/246 |
| 5,685,477 | 11/1997 | Mallik et al. | 228/254 |
| 5,749,614 | 5/1998 | Reid et al. | 294/64.1 |
| 5,762,258 | 6/1998 | Le Coz et al. | 228/56.3 |
| 5,768,775 | 6/1998 | Nakazato | 29/843 |
| 5,816,482 | 10/1998 | Grabbe | 228/212 |
| 5,839,641 | 11/1998 | Teng | 228/41 |
| 5,844,316 | 12/1998 | Mallik et al. | 257/738 |
| 5,890,283 | 4/1999 | Sakemi et al. | 29/840 |

FOREIGN PATENT DOCUMENTS

| | | |
|---|---|---|
| 64-22049 | 1/1989 | Japan . |
| 7-283224 | 10/1995 | Japan . |
| 8-25035 | 1/1996 | Japan . |
| 9-298355 | 11/1997 | Japan . |
| 10-22619 | 1/1998 | Japan . |

*Primary Examiner*—Gregory Mills
*Assistant Examiner*—Kiley Stoner
*Attorney, Agent, or Firm*—Young & Thompson

[57] ABSTRACT

A solder ball arrangement device has a thin arrangement plate having a plurality of through-holes of a truncated pyramid shape, a porous member bonded to the arrangement plate, and a housing member for receiving the arrangement plate and the porous member for defining an air space inside the housing member. A suction pump is provided to evacuate the air space and to receive an array of solder balls in the through-holes by suction. The through-holes are formed by etching, and the porous member reinforces the thin arrangement plate.

14 Claims, 5 Drawing Sheets

1

SOLDER BALL ARRANGEMENT DEVICE

BACKGROUND OF THE INVENTION (a) Field of the Invention

The present invention relates to a solder ball arrangement device and, more particularly, to a solder ball arrangement device for use in transferring an array of solder balls onto a mounting board to form an array of bump electrodes in a BGA (ball grid array) technique, a CSP (chip size package) technique, or a flip chip bonding technique. The present invention also relates to a method for fabrication thereof.

(b) Description of the Related Art

Bump electrodes formed by a BGA technique, a CSP technique, and a flip chip bonding technique are increasingly used in mounting a semiconductor chip onto a mounting board. In the recent advance of semiconductor integrated circuits, a large number of external pins are disposed at a smaller pitch, with increased mounting density, reduced device area and increased capacity of the integrated circuits. In the method for forming bump electrodes by using metallic solder balls, it is especially important to arrange a large number of minute metallic solder balls (hereinafter referred to as solder balls) efficiently at a small pitch. Some proposals have been made for forming the bump electrodes.

JP-A-8(1996)-25035, for example, proposes a solder ball transfer device for installing an array of solder balls on a mounting board. FIG. 1A is a schematic cross-sectional view of the proposed solder ball transfer device.

The proposed solder ball transfer device 30 comprises an alignment plate 32 having an array of holes 32a each for receiving a solder ball 31 therein and an associated ejecting pin 33 disposed for each of the holes 32a for ejecting the solder ball 31 from the alignment plate 32. A pattern for the array of the holes 32a is made to be exactly equal to the pattern of bonding pads 35 formed on a target mounting board 34. The ejecting pin 33 is slidably mounted by the alignment plate 32 for protruding from and retracting into an associated slot 32b communicated with a corresponding one of the holes 32a at the bottom thereof. The ejecting pin 33 is of a tube shape having a communicating hole 33a therein communicated with a suction pump not shown in the figure.

In the conventional solder ball transfer device 30, a solder ball 31 is first disposed in each hole 32a, with the alignment plate 32 disposed upside-down. The suction pump is then operated to attract the solder ball 31 to the tip of the ejecting pin 33 through the communication hole 33a. Subsequently, the alignment plate 32 is turned by a mechanism so that the solder balls 31 disposed on the bottom of the alignment plate 32 opposed to the top surface of a mounting board 34. The ejecting pins 33 are then ejected to thrust the solder balls 31 onto the flux 36 on the respective bonding pads 35, as shown in FIG. 1B, followed by release of the solder balls 31 from the ejecting pins 33 by stopping the suction from the suction pump and subsequent retraction of the ejecting pins 33. Thereafter, the mounting board 34 is introduced into a reflow furnace, wherein flux 36 is melted to fix the solder balls 31 onto the bonding pads 35 of the mounting board 34.

It is reported that the conventional solder ball transfer device 30 as described above has an advantage in that the array of the solder balls 31 are transferred to the mounting board 34 with excellent reliability even if the solder ball 31 attracts electrostatic charge and/or moisture. In addition, the solder balls 31 are transferred to correct locations of a mounting board 34 even with the presence of the flux 36.

The conventional solder ball transfer device has, however, a problem in that the complicated structure of the holes 32a and associated slots 32b in the alignment plate 32 raises the cost of the device, especially in the case of a high density ball pattern such as having a small pitch as low as 300 μm with a large number of pads as high as 2000. If the alignment plate is formed by an etching technique for achieving the high density, the alignment plate will suffer from lack of mechanical strength due to a small thickness thereof.

SUMMARY OF THE INVENTION

It is therefore an object of the present invention to provide a solder ball transfer device or solder ball arrangement device which has a simple structure and a sufficient mechanical strength and is capable of being fabricated with a low cost.

It is another object of the present invention to provide a method for fabricating the solder ball arrangement device as mentioned above.

The present invention provides a solder ball arrangement device comprising an arrangement plate having an array of through-holes penetrating the arrangement plate, a porous member having first and second surfaces, the first surface being attached to the arrangement plate, the through-holes exposing portions of the first surface, and a housing member for defining an air space together with the second surface of the porous member, the housing member having a nozzle or air outlet communicated with the air space.

The present invention also provides a method for manufacturing a solder ball arrangement device comprising the steps of forming an array of through-holes in a plate, bonding a first surface of the plate onto a porous member for exposing portions of the porous member through the through-holes, and receiving at least the porous member in a housing member having an air nozzle or air outlet to form an air space between the porous member and a portion of the housing member.

In accordance with the solder ball arrangement device of the present invention and manufactured by the method of the present invention, a high density solder pattern can be formed on the arrangement plate and can be transferred therefrom onto a mounting board. The arrangement plate may be made thin enough for allow an etching process for forming the through-holes without suffering from lack of the strength thereof because the arrangement plate is supported by the porous member.

The above and other objects, features and advantages of the present invention will be more apparent from the following description, referring to the accompanying drawings.

PREFERRED EMBODIMENTS OF THE INVENTION

Figure 1A:
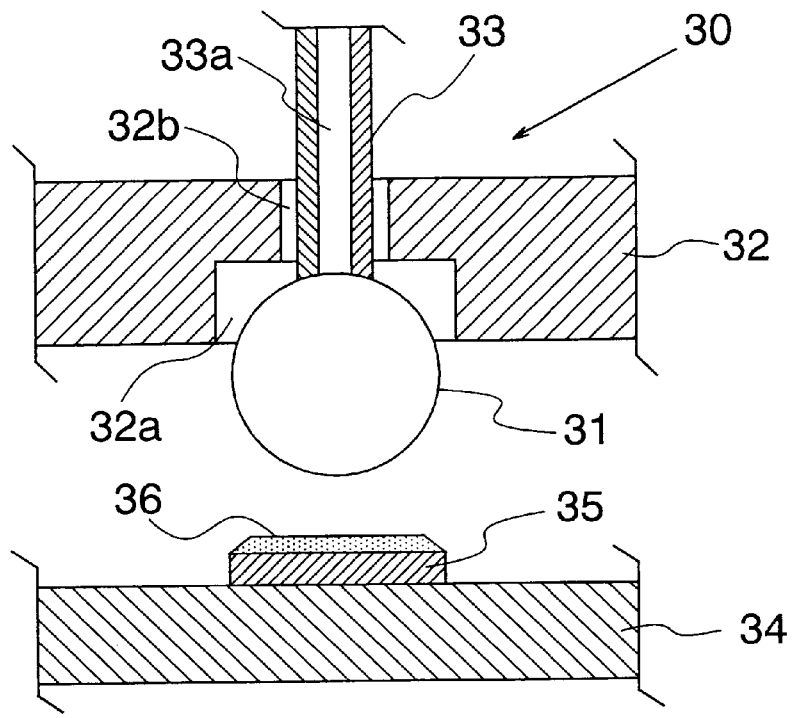
FIGS. 1A and 1B are sectional views of a conventional solder ball transfer device during consecutive steps of transfer of the solder ball.
Figure 1B:
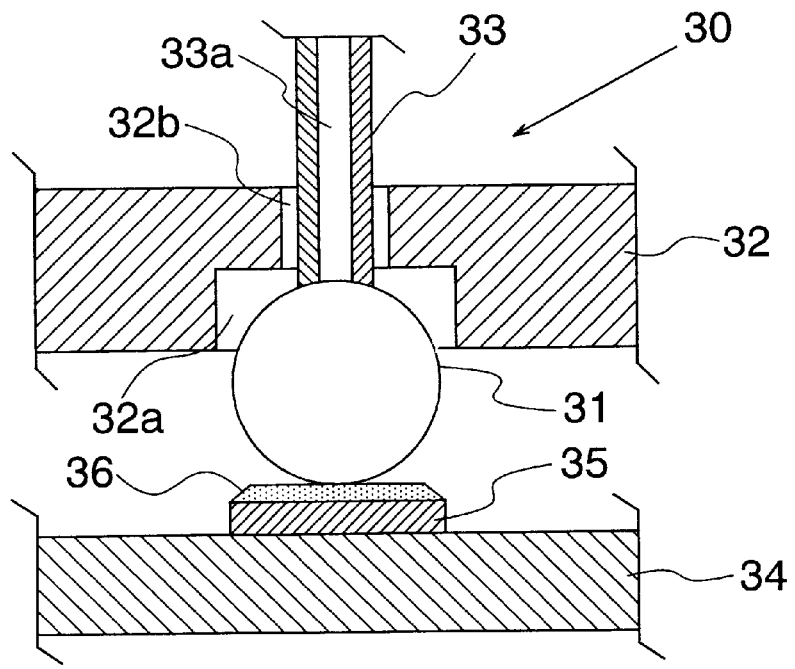

Now, the present invention is more specifically described with reference to accompanying drawings. Referring to FIG.

2, a solder ball arrangement device 11 according to a first embodiment of the present invention comprises an arrangement plate 13 having therein an array of through-holes 13a having a tapered inner surface, a porous member 15 made of a porous material and bonded to the arrangement plate 13, and a housing member 14 for receiving the arrangement plate 13 and the porous member 15, with an air space 14a left below the bottom of the porous member 15. The housing member 14 has a nozzle or air outlet 14b communicated with the air space 14a. A vacuum pump not shown in the figure is connected to the nozzle 14b of the housing member 14 for suction of air from the air space 14a. Each through-hole 13a of the arrangement plate 13 can receive therein a solder ball 12 and has a truncated pyramid shape, the larger bottom of which is directed upward during arrangement of the solder balls 12 in the through-holes 13a.

The arrangement plate 13 is made of silicon, for example. The porous member 15 is made of a ceramic or a metal such as aluminum. The through-holes 13a are arranged corresponding to the pattern of an array of bonding pads of a mounting board on which the solder balls 12 are to be mounted.

Figure 2:
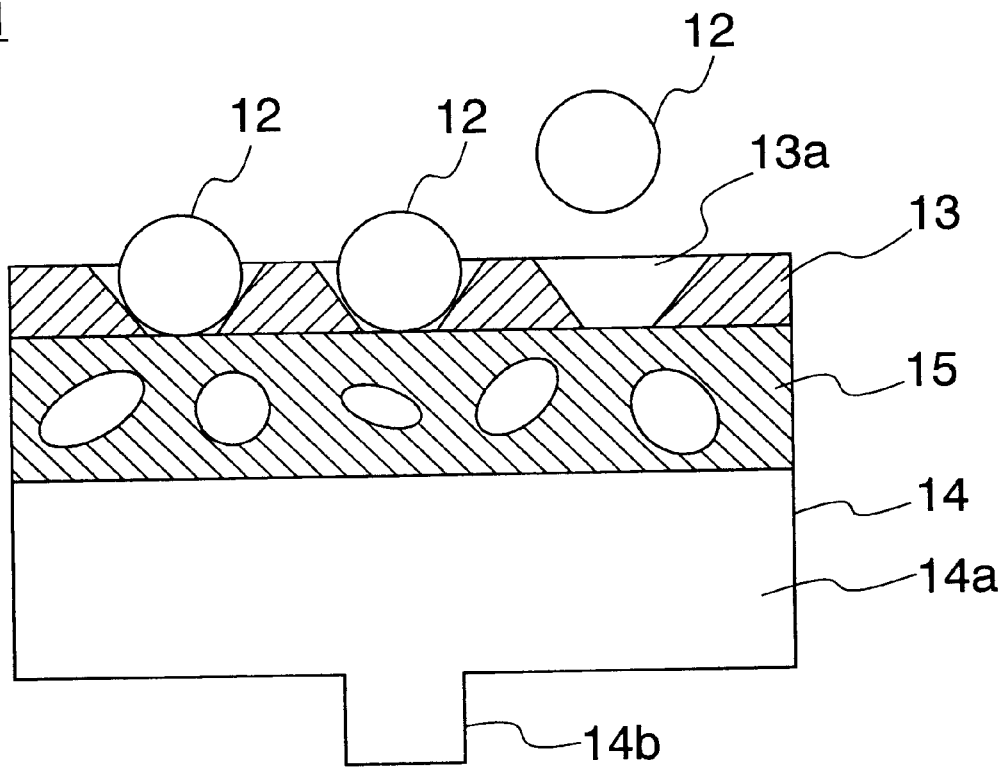
FIG. 2 is a sectional view of a solder ball arrangement device according to a first embodiment of the present invention during arrangement of solder balls thereon.
Figure 3A:
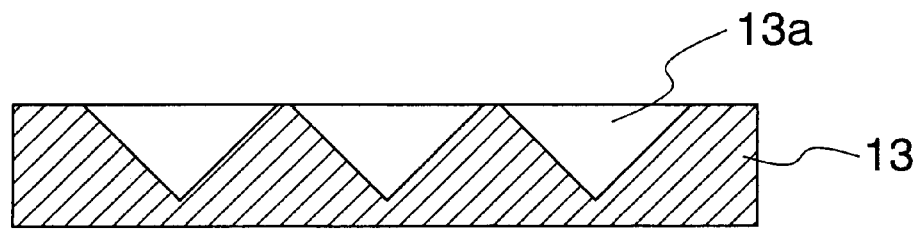
FIGS. 3A to 3C are sectional views of the solder ball arrangement device of FIG. 2 during consecutive steps for fabrication thereof.
Figure 3B:
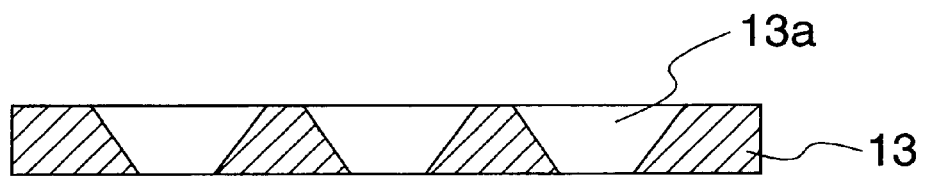
Figure 3C:
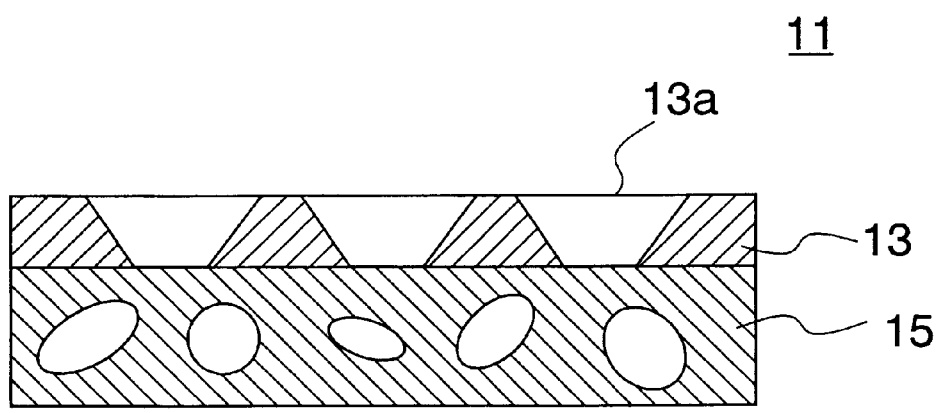

FIGS. 3A to 3B show a fabrication process of the solder ball arrangement device of FIG. 2. A silicon arrangement plate 13 having a thickness of about 300 $\mu$m is first prepared. An array of holes 13a each having a pyramid shape are formed on the first (top) surface of the silicon arrangement plate 13 by an anisotropic etching technique, as shown in FIG. 3A. The array of the holes 13a corresponds to a pattern of bonding pads on which solder balls are to be mounted. The silicon arrangement plate 13 is then ground at the second (bottom) surface of the silicon arrangement plate 13 opposed to the first surface by using a chemical-mechanical polishing technique or grinding technique, thereby forming through-holes 13a each having a truncated pyramid shape, as shown in FIG. 3B. The anisotropic etching technique can provide a pattern of a larger number of truncated pyramid holes 13a with a smaller pitch and at a lower cost without suffering from lack of mechanical strength, compared to the conventional technique. An isotropic etching technique may be also used instead of the anisotropic etching technique. In this case, an array of truncated conical holes can be formed.

The silicon arrangement plate 13 is then coated with an adhesive and bonded to a porous member 15 made of a ceramic, with the top of the truncated pyramid hole 13a are directed to the is porous member 15, and with the bottom of the truncated pyramid hole 13a being open. That is, the hole has a profile in a cross-section in a vertical plane which is smaller toward the porous member 15.

The arrangement plate 13 and the porous member 15 are then received in the housing member 14, as shown in FIG. 2, with the top surface of the arrangement plate 13 being flush with the top opening of the housing member 14, and with the bottom surface of the porous member 15 defining the air space 14a within the housing member 14.

In operation, a plurality of solder balls 12 are provided in the respective through-holes 13a for arrangement. During the provision of the solder balls 12, the housing member 14 may be subjected to oscillation to effectively arrange the solder balls 12 inside the truncated pyramid holes 13a. In the present embodiment, the truncated pyramid hole 13a has the larger bottom opening of the pyramid exposed which effectively receives the solder ball 12. After the arrangement of the solder balls 12, a suction pump is operated to attract the solder balls 12 to the smaller bottom of the respective truncated pyramid holes 13a. Subsequently, the solder ball arrangement device 11 is turned upside-down together with the solder balls 12 so that the array of the solder balls 12 are opposed to an array of bonding pads on a mounting board. The solder ball arrangement device 11 is then thrust against the mounting board to press the array of solder balls 12 onto the respective bonding pads, followed by stoping operation of the suction pump, thereby transferring the solder balls onto the mounting board. During the transfer of the solder balls, the solder ball arrangement device is heated up to a melting point of the solder balls.

The solder ball arrangement device according to the present embodiment has a simple structure, and accordingly, can be manufactured at a lower cost. In addition, since the silicon arrangement plate 13 having a small thickness is bonded onto a porous member 15 having a larger thickness, e.g., 5 mm, the mechanical strength of the solder ball arrangement device is improved.

Figure 4:
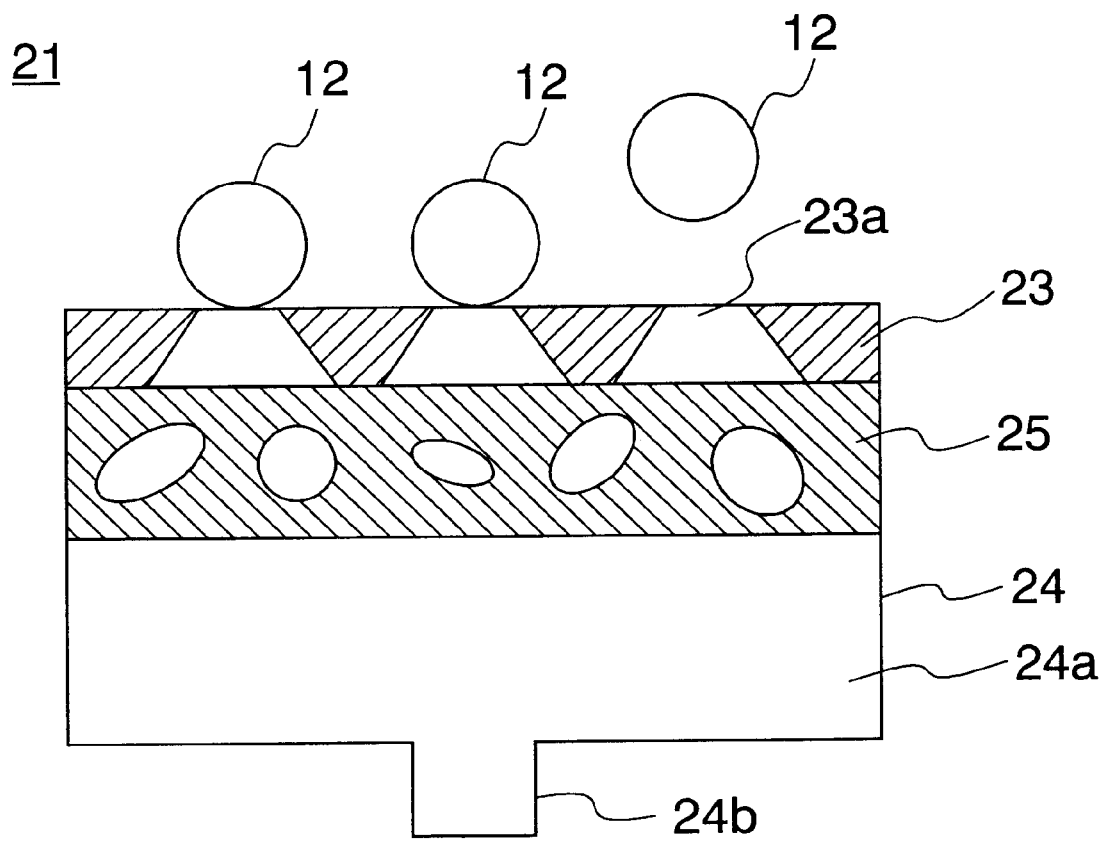
FIG. 4 is a sectional view of a solder ball arrangement device according to a second embodiment of the present invention.

Referring to FIG. 4, a solder ball arrangement device 21 according to a second embodiment of the present invention comprises an arrangement plate 23 having a plurality of truncated pyramid holes 23a for arranging solder balls 12, and a porous member 25 bonded thereto, and a housing member 24, which are similar to those in the first embodiment.

The arrangement plate 23 has an array of truncated pyramid holes 23a, the larger bottom surface of which opposes to the porous member 25. The top of the truncated pyramid hole 23a has a size smaller than the diameter of the solder balls 12. The solder balls 12 are attracted to the top of the truncated pyramid holes 23a. In this configuration, the attracting force by the vacuum is larger than that in the first embodiment. In addition, it is possible to prevent two or more solder balls 12 from attaching to one of the pyramid holes 23a.

Figure 5A:
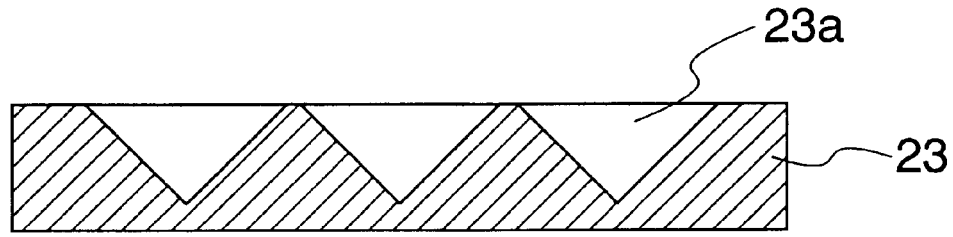
FIGS. 5A to 5C are sectional views of the solder ball arrangement device of FIG. 4 during consecutive steps for fabrication thereof.
Figure 5B:
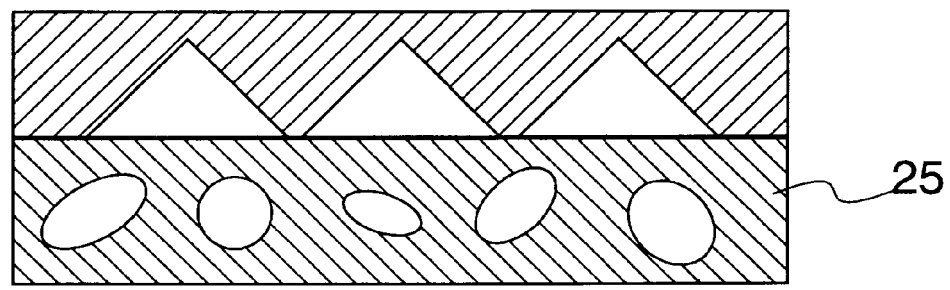
Figure 5C:
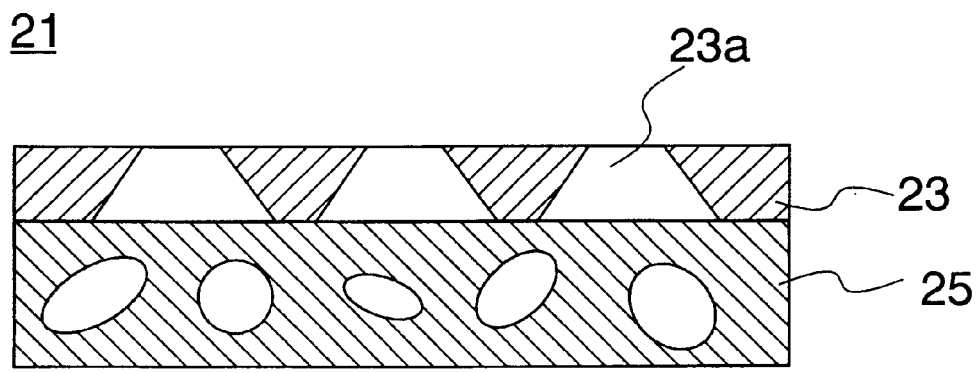

FIGS. 5A to 5C show a fabrication process of the solder ball arrangement device of the present embodiment. A silicon plate 23 having a thickness of 300 $\mu$m is first prepared. An array of holes 23a each having a pyramid shape is formed on the first (top) surface of the silicon plate 23 by an anisotropic etching technique, as shown in FIG. 5A. The array of the pyramid holes 23a correspond to a pattern of bonding pads on which solder balls are to be mounted. The anisotropic etching technique provides a pattern of a larger number of holes with a smaller pitch and at a lower cost, compared to the conventional technique. An isotropic etching technique may be used instead of the anisotropic etching technique to provide conical holes.

The silicon plate 23 is then coated with an adhesive and bonded to a porous member 25 made of a ceramic, with the larger bottoms of the pyramid holes 23a are directed to the porous member 15. The silicon plate 23 is then ground at the second (top) surface of the silicon plate 23 opposed to the first surface by using a chemical-mechanical polishing technique or grinding technique, thereby forming truncated pyramid holes 23a each penetrating the arrangement plate 23, as shown in FIG. 5C. In this embodiment, the grinding of the arrangement plate 23 after bonding the same to the porous member 25 having a thickness of 5 mm, for example, results in less failure because of the reinforced mechanical strength of the arrangement plate 23. The arrangement plate 23 and the porous member 25 are then received in a housing, similar to the first embodiment, to complete the solder ball arrangement device of the second embodiment.

Since the above embodiments are described only as examples, the present invention is not limited to the above embodiments and various modifications or alterations can be easily made therefrom by those skilled in the art without departing from the scope of the present invention. For example, the materials or the shapes of the arrangement plate or porous member are not limited to the above embodiments.

What is claimed is:

1. A solder ball arrangement device comprising:

an arrangement plate having a plurality of through-holes penetrating said arrangement plate, a porous member having first and second surfaces, said first surface being attached to said arrangement plate, each of said plurality of through-holes defining an exposed portion of said first surface, and a housing member for defining an air space together with said second surface of said porous member, said housing member having an air outlet communicated with said air space.

2. A solder ball arrangement device as defined in claim 1, wherein each of said plurality of through-holes narrows toward said porous member.

3. A solder ball arrangement device as defined in claim 1, wherein each of said plurality of through-holes widens toward said porous member.

4. A solder ball arrangement device as defined in claim 1, wherein each of said plurality of through-holes has a truncated pyramid shape.

5. A solder ball arrangement device as defined in claim 1, wherein each of said plurality of through-holes has a truncated conical shape.

6. A solder ball handling device comprising:

a receiving plate having a plurality of alignment holes therethrough for receiving a plurality of solder balls, an air-permeable layer having first and second surfaces, said first surface being attached to a bottom surface of said receiving plate; and an air chamber enclosed by said second surface of said air-permeable layer and having an air outlet connected to said air chamber, each of said plurality of alignment holes exposing a portion of said first surface, each of the exposed portions of said first surface allowing air in the respective one of said alignment holes to pass from said first surface to said second surface through said air-permeable layer.

7. The solder ball handling device of claim 6, wherein each of said plurality of alignment holes has an opening adjacent to the first surface that is smaller than a diameter of each of the plurality of solder balls.

8. The solder ball handling device of claim 6, wherein each of said plurality of alignment holes comprises a tapered hole having a first cross-section on a top surface of said receiving plate and a second cross-section on said bottom surface of said receiving plate.

9. The solder ball handling device of claim 8, wherein said first cross-section is larger than said second cross-section.

10. The solder ball handling device of claim 8, wherein said first cross-section is smaller than said second cross-section.

11. The solder ball handling device of claim 6, wherein said first and second cross-sections each define a circle.

12. The solder ball handling device of claim 6, wherein said first and second cross-sections each define a square.

13. The solder ball handling device of claim 6, wherein said air-permeable layer comprises one of aluminum and ceramic material.

14. The solder ball handling device of claim 6, wherein said receiving plate comprises silicon.

* * * * *